(12) United States Patent
Joh

(10) Patent No.: US 8,822,271 B2
(45) Date of Patent: Sep. 2, 2014

(54) METHOD AND APPARATUS FOR MANUFACTURING CHIP PACKAGE

(71) Applicant: SK hynix Inc., Icheon-si (KR)

(72) Inventor: Cheol Ho Joh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/846,640

(22) Filed: Mar. 18, 2013

(65) Prior Publication Data

US 2014/0170812 A1    Jun. 19, 2014

(30) Foreign Application Priority Data

Dec. 17, 2012    (KR) .................. 10-2012-0147856

(51) Int. Cl.
*H01L 21/00*    (2006.01)
*H01L 23/02*    (2006.01)
*H01L 21/50*    (2006.01)

(52) U.S. Cl.
CPC ..................................... *H01L 21/50* (2013.01)
USPC ........... 438/109; 438/107; 257/685; 257/686

(58) Field of Classification Search
USPC ........................... 438/107, 109; 257/686, 685
See application file for complete search history.

(56) References Cited

U.S. PATENT DOCUMENTS

| 6,448,659 B1 * | 9/2002 | Lee ............................... 257/777 |
| 6,633,086 B1 * | 10/2003 | Peng et al. .................... 257/777 |
| 7,071,568 B1 * | 7/2006 | St. Amand et al. ........... 257/777 |
| 2005/0236705 A1 * | 10/2005 | Lim .............................. 257/678 |
| 2006/0151865 A1 | 7/2006 | Han et al. |
| 2006/0270112 A1 * | 11/2006 | Chao et al. ................... 438/109 |
| 2012/0139125 A1 * | 6/2012 | Kang et al. .................... 257/774 |

FOREIGN PATENT DOCUMENTS

| KR | 20050103372 A | 10/2005 |
| KR | 1020060029925 A | 4/2006 |
| KR | 1020120104666 A | 9/2012 |

* cited by examiner

*Primary Examiner* — Karen Kusumakar
(74) *Attorney, Agent, or Firm* — William Park & Associates Ltd.

(57) ABSTRACT

There are proposed a method and apparatus for manufacturing a chip package in which bonding wires are coupled with contact pads in which an overhang holder holds and fixes portions of a surface adjacent to portions where the contact pads are located.

15 Claims, 10 Drawing Sheets

METHOD AND APPARATUS FOR MANUFACTURING CHIP PACKAGE

CROSS-REFERENCE TO RELATED APPLICATION

The present application claims priority under 35 U.S.C 119(a) to Korean Application No. 10-2012-0147856, filed on Dec. 17, 2012, in the Korean Intellectual Property Office, which is incorporated herein by reference in its entirety.

BACKGROUND

Various embodiments of this application relate generally to package technology for an electronic element, and more particularly, to a method of manufacturing a chip package including an overhang wire bonding structure and a manufacturing apparatus used in the method.

An electronic element for an electronic device can include a variety of electronic circuit elements. The electronic circuit elements can be integrated into a semiconductor chip or a semiconductor substrate also called a die. A memory semiconductor chip is also a form of a package and can be adopted in an electronic system, such as a computer, a mobile device, or data storage.

As the weight and size of a mobile product, such as a smart phone, is reduced, the size and thickness of a semiconductor chip package mounted on the mobile product is also correspondingly reduced. For a mobile product to perform several functions concurrently, a multi-layered stack chip package on which several semiconductor chips are mounted within one semiconductor package is increasingly being used.

An overhang wire bonding structure, which is conventionally used in a stack chip package, comprises of edge portions of an upper chip protruded externally from a lower chip, thus providing overhang portions, and bonding wires coupled with the overhang portions, when stacking chips in multiple layers. However, it may be difficult to provide a structure for supporting the overhang portion. As a semiconductor chip becomes smaller, a phenomenon in which the overhang portion is bent and bounced by bonding the wires can occur. This bouncing phenomenon can result in inaccurate interconnection of the bonding wires and a defect, such as a crack in the overhang portion.

SUMMARY

An embodiment of the present invention provides an apparatus for manufacturing a chip package, including an overhang holder, configured to hold and fix portions of a surface of a chip adjacent to portions where the contact pads of the chip are located and positioned to be detachable from the surface of the chip; and wire capillary part configured to couple bonding wires with the respective contact pads in a state in which the portions of the surface of the chip have been fixed by the overhang holder.

Another embodiment of the present invention provides an apparatus for manufacturing a chip package, including an overhang holder, configured to hold portions of overhang portions adjacent to the contact pads of an upper chip stacked over a lower chip, so that the overhang portions in which the contact pads are located are protruded externally from the lower chip, and to fix the portions of the overhang portions to the contact pads; and wire capillary part configured to couple bonding wires with the contact pads of the fixed overhang portions.

The overhang holder may include a vacuum adsorption unit configured to hold and fix the portions of the surface of the chip by way of vacuum adsorption and to release the portions of the surface of the chip by releasing the vacuum adsorption.

Another embodiment of the present invention provides a method of manufacturing a chip package, including stacking an upper chip over a lower chip so that overhang portions where the contact pads of the upper chip are located are protruded externally from the lower chip; holding and fixing, by an overhang holder, portions of the overhang portions adjacent to the contact pads of the upper chip; and coupling bonding wires with the contact pads.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Figure 1:
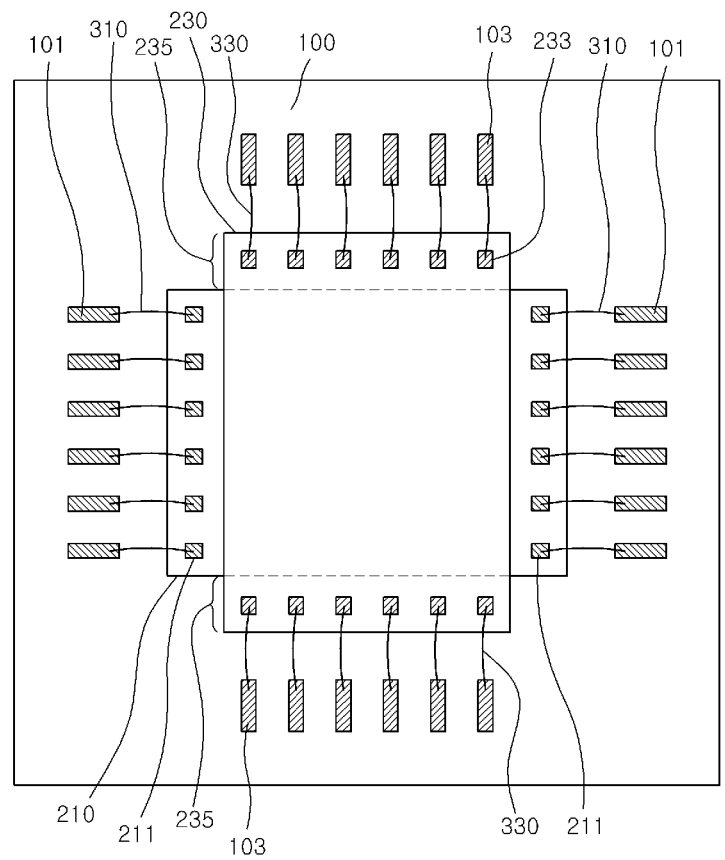
FIG. 1 is a diagram illustrating a structure of a chip package in accordance with an embodiment of the present invention.

Hereinafter, various embodiments of the present invention will be described with reference to accompanying drawings. However, the embodiments are for illustrative purposes only and are not intended to limit the scope of the invention.

This application proposes a method and apparatus for manufacturing a chip package which can suppress a bouncing phenomenon in an overhang bonding wire structure. The apparatus for manufacturing a chip package can prevent an overhang portion of a chip, floating without substantial support, from being downwardly bent or bounced due to pressure or bonding of the wires, by using an overhang holder for substantially holding and fixing part of a top surface of the overhang portion when connecting and bonding the bonding wires to the overhang portion.

The overhang holder may suppress the bouncing of the overhang portion due to the bonding impact by substantially holding and fixing the chip surface of the overhang portion by way of vacuum adsorption and maintaining the fixed state during a wire bonding process. As a result, the width or length of the overhang portion can be substantially reduced. Since the overhang holder can be detached from the chip surface by releasing the vacuum adsorption after the wire bonding process, a bouncing phenomenon in the overhang portion can be suppressed even without using an additional member in the chip surface or under the chip, or a package substrate on which the chip is mounted. Accordingly, the occurrence of a failure resulting from the bouncing phenomenon of the overhang portion can be effectively suppressed by introducing the overhang holder while keeping the rest of the chip package structure unchanged.

In the following description of various embodiments of the present invention, terms such as a 'first' and a 'second' are used to only distinguish elements from each other and are not intended to limit the elements themselves or to specify an order. Furthermore, when it is described that one element is disposed 'on', 'over', 'under', 'below', or 'on the side of' the other element, it refers to a relative position and does not limit to a specific case where the one element has a direct contact with the other element or where a third element is disposed between the two elements. Furthermore, a term 'chip' may mean a semiconductor chip into which integrated circuits are integrated, a memory chip into which memory integrated circuits, such as DRAMs or flash memories, are integrated, a semiconductor substrate, or a logic chip into which logic integrated circuits are integrated. The chip may be interpreted as a die or a substrate into which integrated circuits are integrated. A term 'overhang portion' is part of a chip that can be interpreted as floating unsupported without having a lower side thereof, or can be interpreted as an edge portion externally protruded from an upper chip in a structure in which the edge portion of the upper chip stacked on a lower chip is protruded externally from the lower chip. Contact pads, that is, connection terminals for electrical and signal connections, can be provided on a surface of the overhang portion. The contact pads can be interpreted as connection terminals for external connections formed in a surface of the chip. Bonding wires can be interpreted as members for coupling the contact pads and the bonding fingers of a package substrate together from electrical and signal viewpoints. A term 'package substrate' is a member on which a chip is mounted and can be of various forms, including a wire substrate having a chip mounted on a surface thereof or a chip embedded within the body thereof. The bonding fingers can be interpreted as connection terminals provided on the package substrate for electrical and signal connections.

Referring to FIG. 1, the chip package can have a structure in which semiconductor chips 210 and 230 are stacked over a package substrate 100. Additional semiconductor chips can be stacked over the semiconductor chips 210 and 230. First contact pads 211 and second contact pads 233 can be disposed at edge portions of the semiconductor chips 210 and 230. The semiconductor chips 210 and 230 can be the same or different types of chips in relation to size, shape, or function. The package substrate 100 can include a Printed Circuit Board (PCB) and can include the arrangement of first bonding fingers 101 and second bonding fingers 103. First bonding wires 310 can be used to couple the first contact pads 211 and the first bonding fingers 101 together, and second bonding wires 330 can be used to couple the second contact pads 233 and the second bonding fingers 103 together.

The semiconductor chips 210 and 230 can be sequentially stacked over the package substrate 100, and the upper chip 230 can be stacked over the lower chip 210 in such a way where edge portions of the upper chip 230 can be protruded externally from the lower chip 210 without covering the lower chip 210, thereby forming overhang portions 235. The second contact pads 233 can be located within the overhang portions 235. Even when the size of the upper chip 230 is greater than that of the lower chip 210, the overhang portions 235 of the upper chip 230 can be protruded externally from the lower chip 210.

Conventionally, when forming the second bonding wires 330 that couple the second bonding fingers 103 and the second contact pads 233 located in the overhang portions 235 together, a bouncing phenomenon in which the second bonding wires 330 are bent due to pressure can occur because the overhang portions 235 are floating. The bouncing phenomenon can become a limiting factor in adopting an overhang bonding wire structure that has second bonding wires 330 bonded to the overhang portions 235. If means for holding and fixing the overhang portion 235 is used, the bouncing phenomenon can be substantially minimized or effectively suppressed because the protruded length or width of the overhang portion 235 is substantially reduced.

Figure 2:
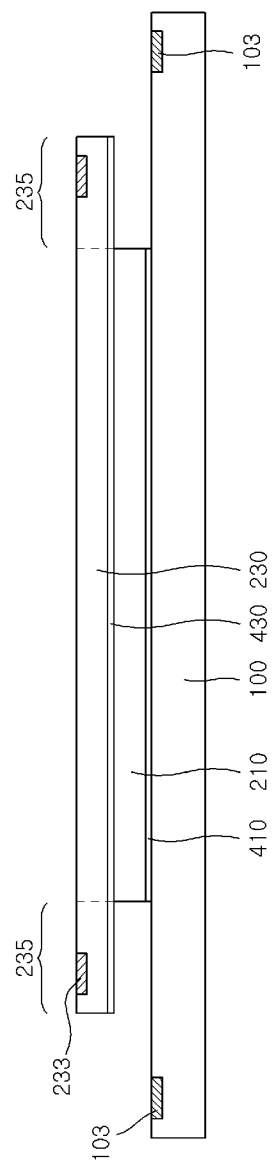
FIGS. 2 to 5 are diagrams illustrating a method and apparatus for manufacturing a chip package in accordance with an embodiment of the present invention.

Referring to FIGS. 1 and 2, the lower chip 210 may be stacked over the package substrate 100. The upper chip 230 may be stacked over the lower chip 210 so that the overhang portions 235 are protruded externally from the lower chip 210. The lower chip 210 can be adhered to the package substrate 100 with a first adhesion layer 410 interposed between the lower chip 210 and the package substrate 100, and a process of coupling the first bonding wires 310 with the lower chip 210 can be performed. The upper chip 230 can be adhered to the lower chip 210 with a second adhesion layer 430 interposed between the upper chip 230 and the lower chip 210. The second contact pads 233 may be located within the overhang portions 235 protruded externally from the lower chip 210.

Figure 3:
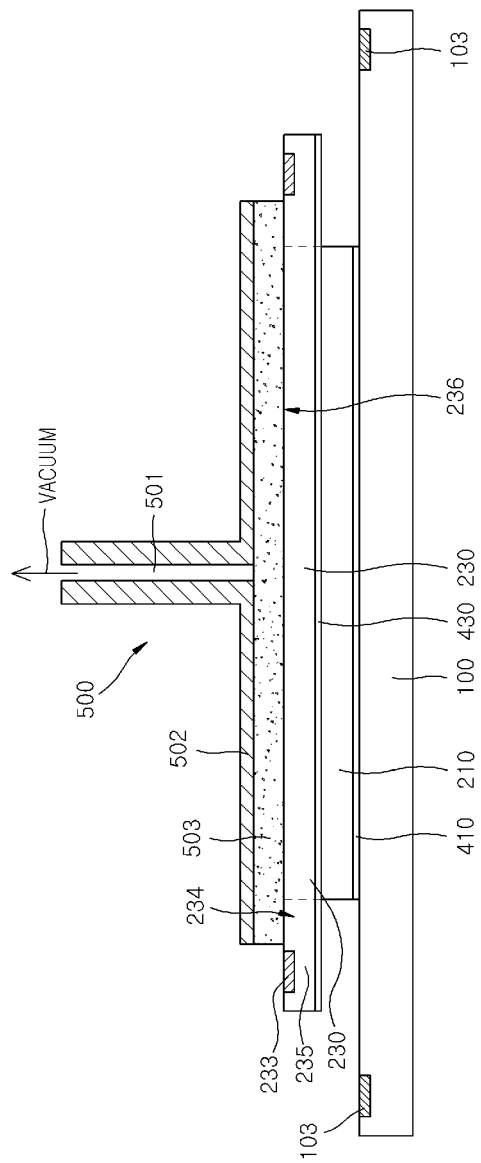

Referring to FIGS. 1 and 3, portions 234 of the overhang portions 235 adjacent to the second contact pads 233 of the upper chip 230 may be held and fixed by overhang holders 500. The overhang holder 500 can be used as a unit for substantially holding and fixing the portions 234 of the overhang portions 235 by way of vacuum adsorption. For example, the overhang holder 500 can include a unit having a vacuum adsorption head form which includes a vacuum adsorption plate 503 configured to have a size that can extend to the portions 234 of the overhang portions 235, a body unit 502 configured to support the vacuum adsorption plate 503, and a vacuum line 501 formed within the body unit 502.

The vacuum adsorption plate 503 can include a porous adsorption plate configured to come into contact with a top surface 236 of the upper chip 230 and adsorb the top surface 236 by way of vacuum. The porous adsorption plate can be made of a porous material having a plurality of hollows and can be made of a soft material, such as polymer. The porous vacuum adsorption plate 503 made of the soft material can be closely adhered to the top surface 236 of the upper chip 230 and thus can be subject to vacuum evacuation through the vacuum line 501 coupled with the rear of the vacuum adsorption plate 503. Since the porous material provides a vacuum suction path. Vacuum adsorption force can be supplied between the vacuum adsorption plate 503 and the top surface 236 of the upper chip 230 so that the top surface 236 can be adsorbed and fixed to the vacuum adsorption plate 503. Since the vacuum adsorption plate 503 may be extended to cover the portions 234 of the overhang portions 235, the overhang portions 235 can be substantially fixed to the overhang holder 500 by way of the vacuum adsorption.

Figure 4:
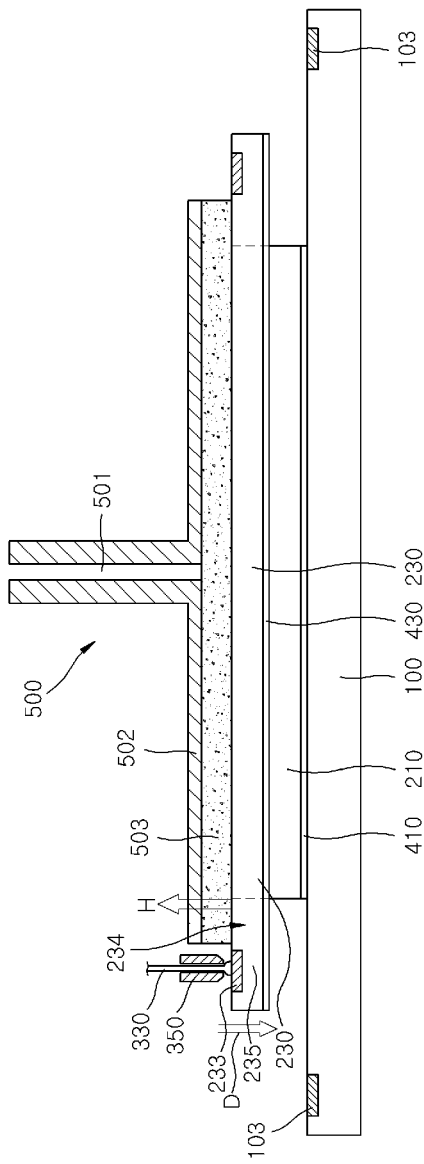

Referring to FIG. 4, a process of bonding the second bonding wires 330 to the second contact pads 233 may be performed when the portions 234 of the overhang portions 235 are held and fixed by the overhang holder 500. Wire capillary part 350 is moved so that they are aligned over the second contact pads 233 in order to transfer pressure D to the overhang portions 235 so that the ends of the second bonding wires 330 are bonded to the second contact pads 233. The overhang holder 500 can provide offset force H against the pressure D that is accompanied by the wire bonding process. For example, the vacuum adsorption force provided by the overhang holder 500 may be provided to the vacuum adsorption plate 503 and top surfaces of the portions 234 of the overhang portions 235. This vacuum adsorption force can function as the offset force H, thereby being capable of suppressing or hindering the bending of the overhang portions 235 in a downward direction due to the pressure D. Since the bending of the overhang portions 235 may be suppressed, a bouncing phenomenon can be effectively suppressed and the occurrence of a crack can be effectively prevented.

Figure 5:
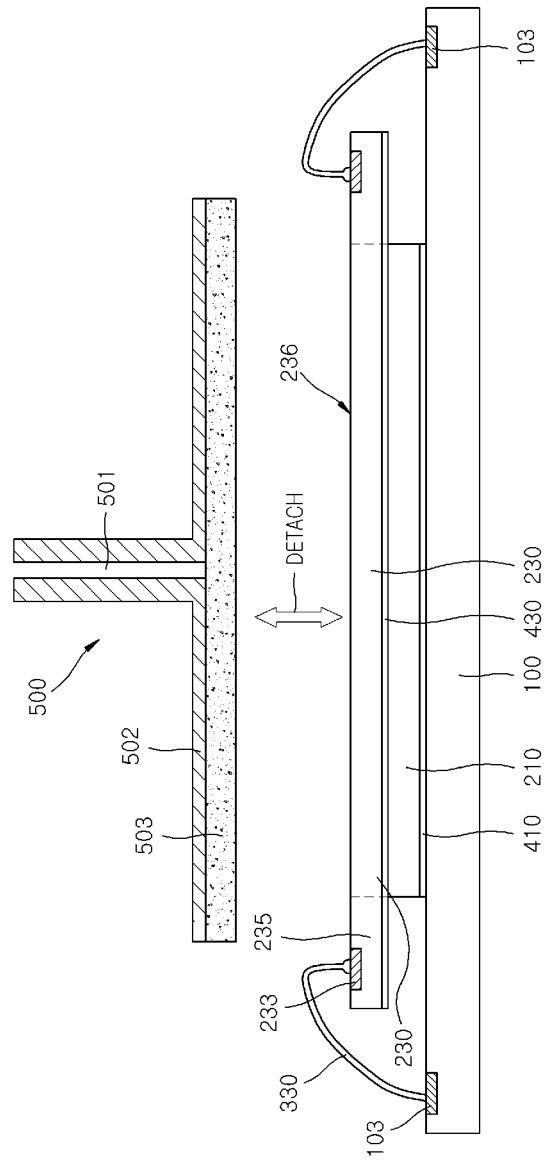

Referring to FIG. 5, after completing the process of bonding the second bonding wires 330 to the second contact pads 233 when the overhang portions 235 are substantially fixed by the overhang holder 500, the second bonding wires 330 may electrically couple the second contact pads 233 and the second bonding fingers 103 together. Next, the vacuum adsorption state may be released, and the overhang holder 500 may be detached from the top surface 236 of the upper chip 230.

Additional means for fixing or supporting the overhang portions 235 can be omitted because the overhang holder 500 functions to temporarily hold or release the overhang portions 235 by way of vacuum adsorption.

After stacking additional chips (not shown) over the upper chip 230 in a similar manner to the upper chip 230 being stacked over the lower chip 210, a chip package in which the chips are stacked in larger quantities by performing a wire bonding process, such as the process of bonding the second bonding wires 330, can be formed. Thereafter, a protection layer for protecting the upper chip 230 and the bonding wires (330 and 310 of FIG. 1) can be formed.

Figure 6:
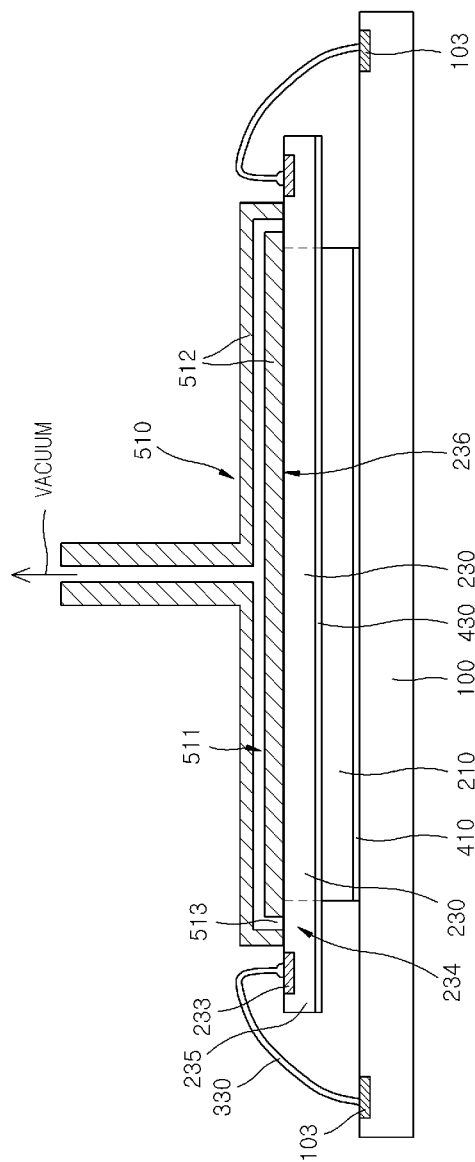
FIGS. 6 and 7 are diagrams illustrating a method and apparatus for manufacturing a chip package in accordance with another embodiment of the present invention.
Figure 7:
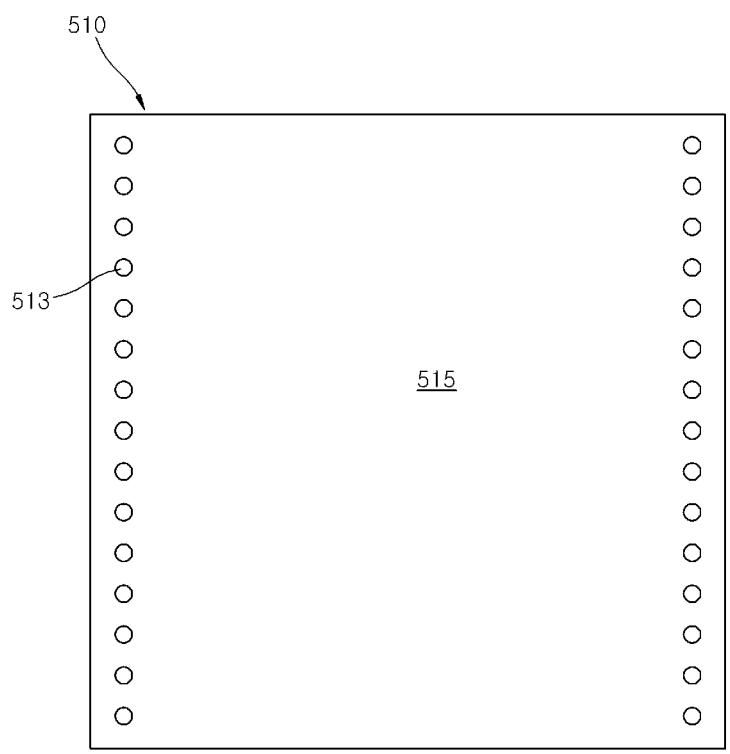

Referring to FIGS. 6 and 7, an overhang holder 510 for fixing overhang portions 235 can include a unit having a vacuum adsorption head form which includes body units 512 configured to provide vacuum holes 513 aligned in respective portions 234 adjacent to the second contact pads 233 of an upper chip 230 and to come into contact with a top surface 236 of the upper chip 230 without covering the second contact pads 233. Vacuum lines 511 coupled with the vacuum holes 513 may be provided within the body units 512. Vacuum evacuation to the vacuum holes 513 can be performed through the vacuum lines 511, and thus the vacuum adsorption force can be provided to the overhang portions 235. As shown in FIG. 7, the vacuum holes 513 can be arranged in a line in each of the portions 234 adjacent to the second contact pads 233 of the upper chip 230.

Figure 8:
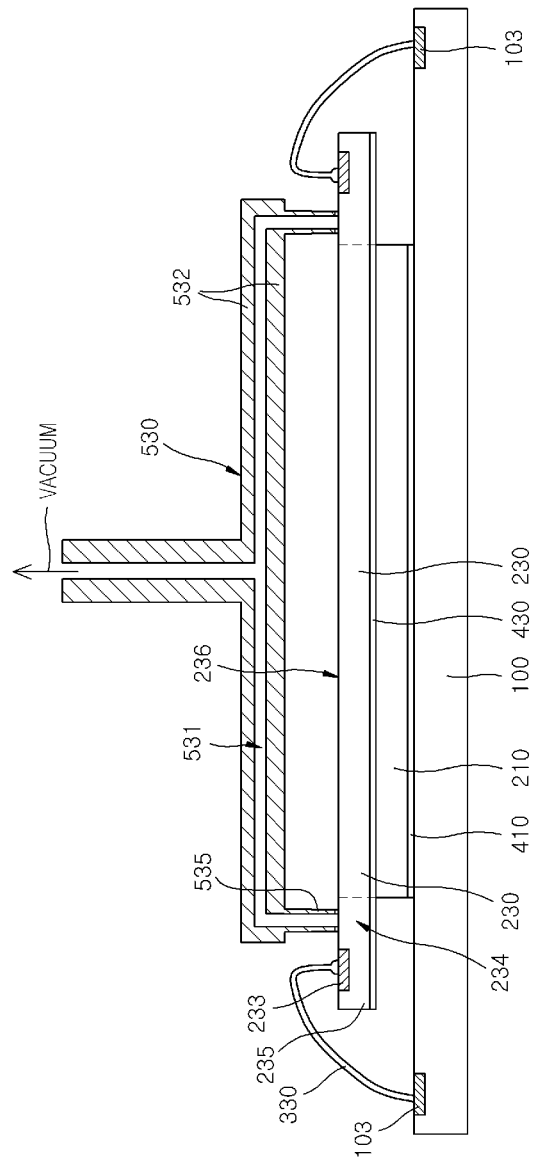
FIGS. 8 and 9 are diagrams illustrating a method and apparatus for manufacturing a chip package in accordance with another embodiment of the present invention.
Figure 9:
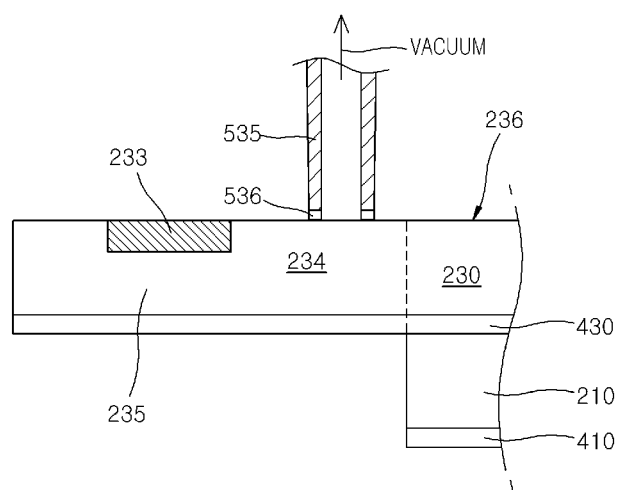

Referring to FIGS. 8 and 9, an overhang holder 530 for fixing overhang portions 235 can include a unit having a vacuum adsorption head form which includes body units 532 configured to support vacuum capillaries 535 aligned in portions 234 adjacent to the second contact pads 233 of an upper chip 230. The ends of the vacuum capillaries 535 can come into contact with the respective portions 234 adjacent to the second contact pads 233 in a top surface 236 of the upper chip 230, and only the portions of the top surface 236 with which the vacuum capillaries 535 come in contact can be locally subject to vacuum adsorption and fixed. Portions to be fixed by vacuum adsorption from a region of the overhang portion 235 can be finely controlled, and the size of the vacuum capillary 535 may be relatively reduced. As a result, portions closer to the second contact pads 233 can be effectively fixed. Furthermore, damage to the upper chip 230 or the occurrence of a failure due to the contact with the body unit 532 can be suppressed because the body units 532 are spaced apart from the top surface 236 of the upper chip 230 and the portions 234 of the overhang portions 235.

Vacuum lines 531 coupled with the vacuum capillaries 535 can be provided within the body units 532 and vacuum evacuation to the vacuum capillaries 535 can be performed through the vacuum lines 531, with the result that vacuum adsorption force can be provided to the overhang portions 235. As shown in FIG. 9, a contact pad 536 having a substantially soft property can be attached to the contact ends of the vacuum capillaries 535 in order to suppress damage resulting from the contact with the top surface 236 of the upper chip 230. The soft contact pad 536 can be made of a soft material, such as rubber or polymer.

Figure 10:
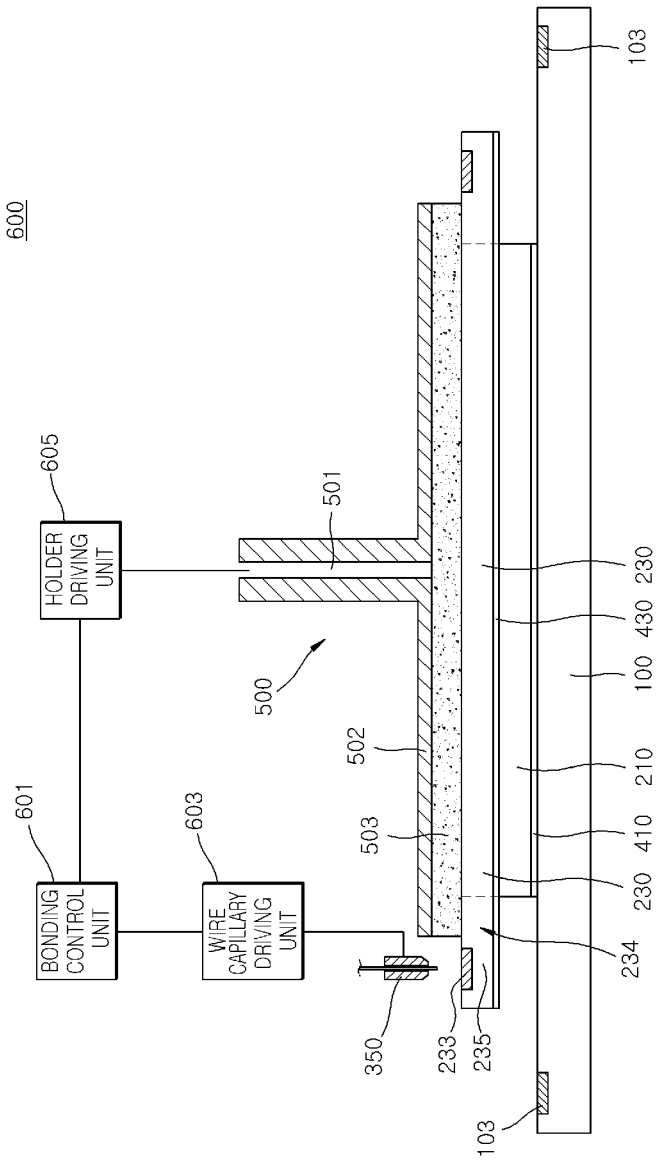
FIG. 10 is a diagram illustrating an apparatus for manufacturing a chip package in accordance with another embodiment of the present invention.

Referring to FIG. 10, the apparatus 600 for manufacturing a chip package can include equipment for performing wire bonding. An overhang holder 500 can be introduced as a unit for holding and fixing portions 234 of the overhang portions 235 of an upper chip 230 by way of vacuum adsorption. The overhang holder 500, as described above with reference to FIGS. 3 to 5, can include a unit having a vacuum adsorption head form which includes a body unit 502 configured to support a vacuum adsorption plate 503 and a vacuum line 501 formed within the body unit 502.

The overhang holder 500, as described above with reference to FIGS. 6 and 7, can be modified into an overhang holder (see 510 of FIG. 6) having a vacuum adsorption head form which includes body units 512 configured to provide vacuum holes 513 aligned in respective portions 234 adjacent to the second contact pads 233 of an upper chip 230 and to come into contact with a top surface 236 of the upper chip 230 without covering the second contact pads 233. The overhang holder 500, as described above with reference to FIGS. 8 and FIG. 9, can be modified into an overhang holder (see 530 of FIG. 8) including body units 532 configured to support vacuum capillaries 535.

Vacuum adsorption units, such as the vacuum holes (see 513 of FIG. 6), the vacuum adsorption plate (see 503 of FIG. 3), and the vacuum capillaries (see 535 of FIG. 8), provide functions that enable the overhang holder 500, 510, or 530 to hold and fix portions of a surface of the upper chip 230, for example, portions of the overhang portions 235. By releasing the vacuum adsorption function of the vacuum adsorption units, the vacuum adsorption units can be released from a surface of the upper chip 230, and the detachable overhang holder 500, 510, or 530 can be configured.

The overhang holder 500, as described above with reference to FIGS. 3 to 5, may perform operations for holding and fixing the overhang portions 235, maintaining the fixing state, and releasing the vacuum adsorption units from a surface of the upper chip 230 by releasing a vacuum state. The operations of the overhang holder 500 can be performed by a holder driving unit 605 mechanically coupled with the overhang holder 500. A wire capillary driving unit 603 for performing an operation of coupling the wire capillary part 350 with the bonding wires 330 in connection with the driving of the holder driving unit 605 can be mechanically coupled with the wire capillary part 350. The apparatus 600 for manufacturing a chip package can be configured so that a bonding control unit 601 controls the entire wire bonding process by controlling the wire capillary driving unit 603 and the holder driving unit 605.

The embodiments of this application have been disclosed above for illustrative purposes. Those skilled in the art will appreciate that various modifications, additions and substitutions are possible, without departing from the scope and spirit of the invention as disclosed in the accompanying claims.

What is claimed is:

1. An apparatus for manufacturing a chip package, comprising:
   an overhang holder configured to come into contact with an exposed top surface of overhang portions of an upper chip and configured to hold portions of overhang portions adjacent to contact pads of an upper chip stacked over a lower chip so that the overhang portions in which the contact pads are located are protruded externally from the lower chip, and to fix the portions of the overhang portions; and an wire capillary part configured to couple bonding wire with the contact pad.

2. The apparatus of claim 1, further comprising a holder driving unit configured to drive the overhang holder so that the overhang holder holds the portions of the overhang portions adjacent to the contact pads by vacuum adsorption and to detach the overhang holder from the upper chip by releasing the vacuum adsorption.

3. The apparatus of claim 2, further comprising:
a wire capillary driving unit configured to perform an operation of driving the plurality of wire capillary part to couple the bonding wires with the contact pads in connection with the driving of the overhang holder; and
a control unit configured to control the operations of the wire capillary driving unit and the holder driving unit.

4. The apparatus of claim 1, wherein the overhang holder comprises:
a vacuum adsorption plate configured to come into contact with an exposed top surface of the upper chip without covering the contact pads;
a body unit configured to support the vacuum adsorption plate and provide vacuum; and
a vacuum line formed within the body unit.

5. The apparatus of claim 4, wherein the vacuum adsorption plate comprises a porous adsorption plate providing a vacuum suction path.

6. The apparatus of claim 1, wherein the overhang holder comprises body units configured to provide vacuum holes aligned in the respective portions of the overhang portions adjacent to the contact pads and come into contact with an exposed top surface of the upper chip without covering the contact pads.

7. The apparatus of claim 1, wherein the overhang holder comprises:
a plurality of vacuum capillaries aligned in the respective portions of the overhang portions adjacent to the contact pads; and
body units configured to support the vacuum capillaries.

8. The apparatus of claim 7, wherein a soft contact pad is coupled to an end of the vacuum capillary.

9. A method of manufacturing a chip package, comprising:
stacking an upper chip over a lower chip so that overhang portions where contact pads of the upper chip are located are protruded externally from the lower chip;

introducing an overhang holder to contact with an top surface of the overhang portions of the upper chip and to hold and fix the portions of the overhang portions; and coupling bonding wires with the contact pads.

10. The method of claim 9, wherein the overhang holder holds the portions of the overhang portions adjacent to the contact pads by vacuum adsorption.

11. The method of claim 9, wherein the overhang holder comprises:
a vacuum adsorption plate configured to come into contact with an exposed top surface of the upper chip without covering the contact pads;
a body unit configured to support the vacuum adsorption plate; and
a vacuum line formed within the body unit,
wherein the vacuum adsorption plate holds the overhang portions by adsorbing a top surface of the upper chip by vacuum adsorption.

12. The method of claim 11, wherein the vacuum adsorption plate comprises a porous adsorption plate.

13. The method of claim 9, wherein the overhang holder comprises:
a plurality of body units configured to provide vacuum holes aligned in the respective portions of the overhang portions adjacent to the contact pads and come into contact with an exposed top surface of the upper chip without covering the contact pads, and
a plurality of portions of the overhang portions coming into contact with the vacuum holes through the vacuum holes by vacuum.

14. The method of claim 9, wherein the overhang holder further comprises:
a plurality of vacuum capillaries aligned in the respective portions of the overhang portions adjacent to the contact pads; and
a plurality of body units configured to support the plurality of vacuum capillaries,
wherein portions of the overhang portions coming into contact with the plurality of vacuum capillaries are held by vacuum.

15. The method of claim 14, wherein a soft contact pad is coupled to an end of the vacuum capillary.

* * * * *